United States Patent [19]

Lehmann et al.

[11] 4,158,850
[45] Jun. 19, 1979

[54] THYRISTOR HAVING IMPROVED COOLING AND IMPROVED HIGH FREQUENCY OPERATION WITH ADJACENT CONTROL TERMINALS

[75] Inventors: Erhard Lehmann; Heinz Martin; Peter Voss, all of Munich, Fed. Rep. of Germany

[73] Assignee: Siemens Aktiengesellschaft, Berlin & Munich, Fed. Rep. of Germany

[21] Appl. No.: 822,248

[22] Filed: Aug. 5, 1977

[30] Foreign Application Priority Data

Aug. 13, 1976 [DE] Fed. Rep. of Germany ...... 2636631

[51] Int. Cl.² ............................................. H01L 29/74
[52] U.S. Cl. ........................................ 357/38; 357/74; 357/79
[58] Field of Search ............................ 357/38, 74, 79

[56] References Cited

U.S. PATENT DOCUMENTS

| | | | |
|---|---|---|---|
| 3,599,057 | 8/1971 | Lootens | 357/38 |
| 3,886,586 | 5/1975 | Bahlinger et al. | 357/38 |
| 3,896,476 | 7/1975 | Kawakami | 357/38 |
| 3,896,480 | 7/1975 | Harnden | 357/38 |
| 3,975,758 | 8/1976 | Schlegel | 357/38 |

*Primary Examiner*—Joseph E. Clawson, Jr.
*Attorney, Agent, or Firm*—Hill, Van Santen, Steadman, Chiara & Simpson

[57] ABSTRACT

A thyristor comprises a semiconductor element which has a control electrode and an arrangement which amplifies the control current and possesses an auxiliary emitter electrode. A housing encloses the semiconductor element and a control line, by means of which the control electrode is electrically connected to a conduit arranged in a housing wall, is included. A second control line is electrically connected to the auxiliary emitter electrode and to a conduit arranged in the housing wall. The housing is disc-shaped and comprises metal plates and an insulating ring and has a slot which is arranged in one of the metal plates and opens into a recess located opposite the control electrode and the auxiliary emitter electrode. The control line is positioned in the slot and has one end pressed against the control electrode under a spring bias action. The conduit is contained in the insulating ring and the second control line is also located in the slot in one of the metal plates. The second control line likewise opens into the recess and has its one end pressed against the auxiliary emitter electrode.

10 Claims, 4 Drawing Figures

THYRISTOR HAVING IMPROVED COOLING AND IMPROVED HIGH FREQUENCY OPERATION WITH ADJACENT CONTROL TERMINALS

BACKGROUND OF THE INVENTION

1. Field of the Invention

The present invention relates to thyristors, and is more particularly concerned with thyristors having plural control lines.

2. Description of the Prior Art

Thyristors which are used in self-commutating circuits, such as d.c. control elements, inverters, oscillating circuits etc, can be disconnected only by means of extinguishing circuits, the expense of which increases in accordance with the turn-off time. The thyristors are to exhibit a low turn-off time. For devices of systems operating at high frequencies, a short turn-off time is also necessary in order to safeguard the function of the device and to achieve a sufficiently favorable efficiency. A reduction in the turn-off time, by means of switching measures in the control circuit, permits the thyristors to be employed at a higher operating frequency and allows a reduction in the expense of the extinguishing function.

It is well known in the art to provide that thyristors having structures which serve to amplify the control current be supplied with an auxiliary voltage across the emitter electrode of the auxiliary thyristor in order to shorten the turn-off time, the plurality of such auxiliary voltage being opposed to that of the control voltage. This auxiliary voltage can be connected either permanently or only during the turn-off time. The auxiliary voltage serves to withdraw those charge carriers which are stored in the semiconductor body and which could otherwise trigger an ignition when the voltage subsequently increases in the blocking direction. Known realizations for the supply of the auxiliary voltage provide a diode which is arranged in the housing, or which is integrated in the semiconductor body of the thyristor, and which is connected to the auxiliary emitter electrode and the control terminal, and which is poled in such a manner that the control current for the thyristor cannot flow into the auxiliary emitter electrode.

However, these known structures require a control device to supply pulses of both polarities. The expense for the production of the negative auxiliary voltage can be kept lower for many applications, and in many cases it is advantageous if the auxiliary emitter electrode could be directly operated from the exterior, independently of the control electrode; for example, this facilitates the connection of a negative d.c. voltage which is easy to produce.

SUMMARY OF THE INVENTION

The present invention, as noted above, relates to a thyristor having a semiconductor element, which thyristor possesses a control electrode and an arrangement which amplifies the control current, and comprises an auxiliary emitter electrode, and has a housing which encloses the semiconductor element, and with a control line by means of which the control electrode is electrically connected to a conduit arranged in a housing wall.

The primary object of the present invention is to further develop a thyristor of the type mentioned above in such a manner that the auxiliary emitter electrode can be operated independently of the control electrode.

The present invention is characterized by a second control line, which is electrically connected to the auxiliary emitter electrode and to a conduit arranged in the housing wall.

In a thyristor comprising a disc-shaped housing which consists of metal plates and an insulating ring, and comprising a slot which is arranged in one of the metal plates and which opens into a recess located opposite the control electrode and the auxiliary emitter electrode, where the control line is located in the slot and its one end is pressed against the control electrode under a spring bias action, and wherein the conduit is located in the insulating ring, expediently the second control line is also arranged in the slot located in one of the metal plates, and likewise opens into the recess, its one end being pressed against the auxiliary emitter electrode. Both control lines can be located in a common slot, and both conduits can be arranged next to one another. Advantageously, both control lines can consist of wires whose ends, which open into the recess, are bent and abut against the control electrode and auxiliary emitter electrode, where such ends are commonly pressed against the electrode by a spring system arranged in the recess. However, both control lines can also consist of wires whose ends, which open into the recess, are in the form of springs which are concentric with one another.

In a thyristor comprising a housing which possesses a metal base and a cap which consists at least partially of insulating material, wherein a conduit is arranged in the cap and one end of the control line is pressed against the control electrode under a spring action, the second control line can also be connected to a conduit arranged in the cap, its one end being pressed against the auxiliary emitter electrode. Advantageously, the end of the second control line is pressed against the auxiliary emitter electrode by means of a spring system which contacts the control electrode.

Instead of being pressed against the control electrode and auxiliary emitter electrode, the control lines can also be connected to the electrodes so as to be materially bonded thereto.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
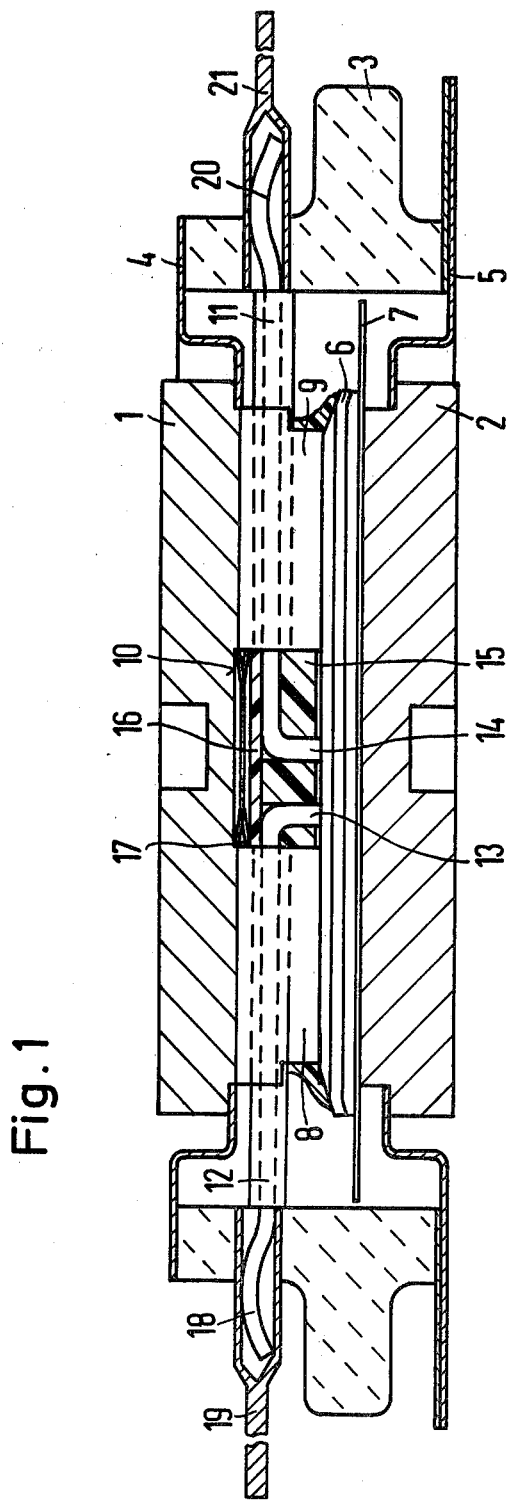
FIG. 1 is a sectional view through a thyristor constructed in accordance with a first embodiment of the invention.

Referring to FIG. 1, a thyristor is illustrated as comprising an upper metal plate 1 and a lower metal plate 2. The metal plates 1 and 2 consist of good heat-conductive material, for example copper. The metal plates 1 and 2 are connected by way of a pair of metal rings 4 and 5 to an insulating ring 3, for example by hard soldering. A semiconductor element 6 is located on the lower metal plate 2, and it is also possible, as indicated on the drawing, to arrange a foil 7 between the semiconductor element 6 and the metal plate 2 in order to improve the electrical contact therebetween. The upper metal plate 1 is arranged on the cathode side of the semiconductor element 6 and is provided with two radial slots 8 and 9. The slots 8 and 9 open into a recess 10, which is arranged centrally in the metal plate 1 and which lies opposite the control electrode of the semiconductor element 6 and an auxiliary emitter electrode of the semiconductor element 6. For clarity, the control electrode and the auxiliary emitter electrode have not been illustrated in detail, but are in contact with the end faces of the control lines, as hereinafter set forth.

The slots 9 and 8 provide passageways for and contain respective first and second control lines 11 and 12 whose respective ends 14 and 13 lie in the recess 10 and are bent at right angles so as to have the end faces thereof abut against the control electrode and the auxiliary emitter electrode. The ends 13 and 14 of the control lines are fixed by means of an insulating component 15. More specifically, the control lines extend through grooves and passageways in the insulating component 15. A compression plate 16 consisting of insulating material is arranged over the ends of the control lines. The ends of the control lines are pressed against the semiconductor element 6, via the compression plate 16, by means of a spring system or springs 17 which bear against the end of the recess and the compression plate 16. The contact pressure is advantageously between 50 and 250 kp/cm$^2$. In order to ensure a reliable contact between the control lines and the assigned electrodes, the thickness of the insulating component 15 is selected to be such that when the ends 13 and 14 are pressed into position, the insulating component 15 either does not touch the surface of the semiconductor element 6 or touches the same with a very slight pressure.

The ends of the control lines 11 and 12 which extend away from the electrodes are referenced 20 and 18, respectively, and are received in respective conduits 21 and 19 which are arranged in the wall of the housing provided by the insulating ring 3. The conduits 19 and 21 are also structured so as to simultaneously serve as terminals for the control electrode and the auxiliary emitter electrode.

Figure 2:
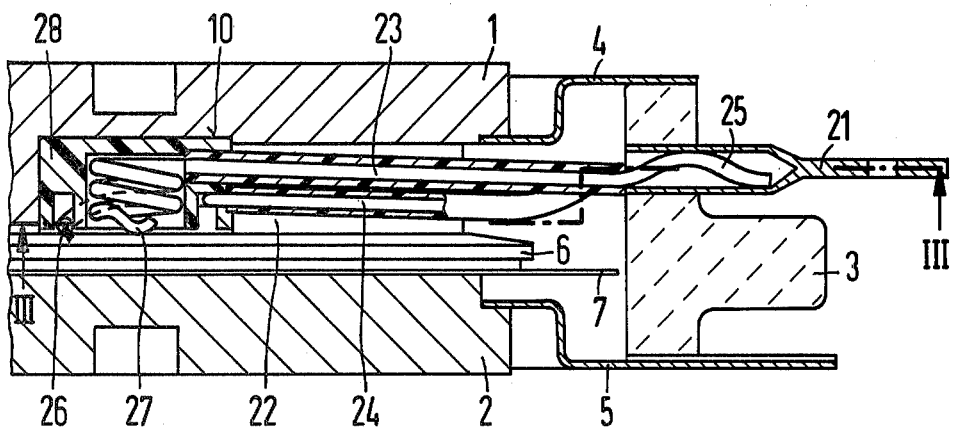
FIG. 2 is a partial section through a thyristor constructed in accordance with a second embodiment of the invention.
Figure 3:
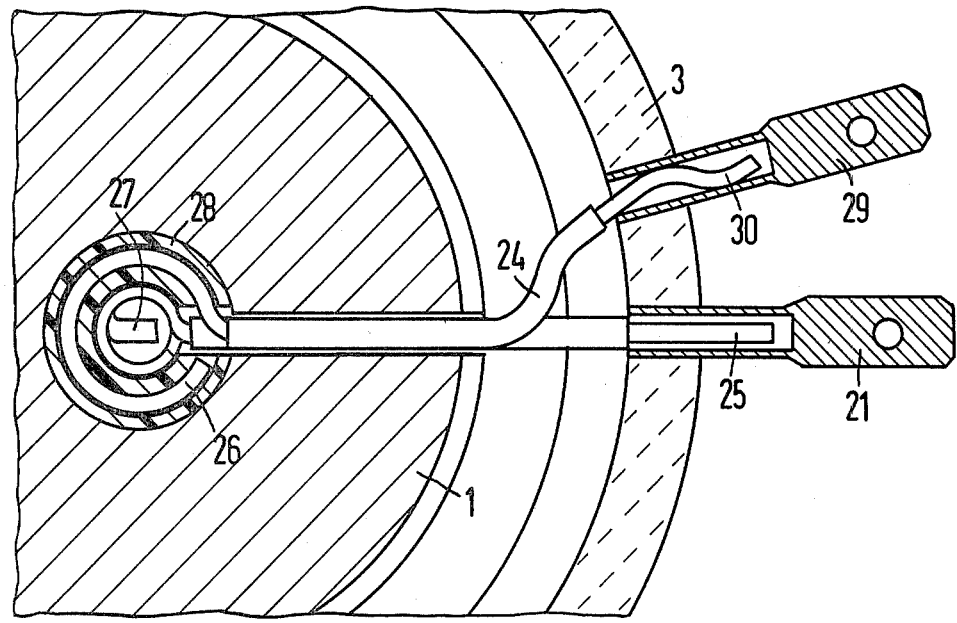
FIG. 3 is a partial plan view of the thyristor of FIG. 2, as viewed substantially along the line III—III of FIG. 2.

Referring to FIGS. 2 and 3, in which elements in common with FIG. 1 have been given like reference characters, the upper metal plate 1 is provided with a slot 22 which contains both control lines 23 and 24 which are assigned to the control electrode and to the auxiliary emitter electrode, the control lines being disposed one above the other. The control lines 23 and 24 have respective ends 27 and 26 which are designed as springs which are concentric with one another. The end 27 of the control line 23 is a helical spring, whereas the end 26 of the control line 24 is also of helical configuration, but contains only one turn. Those ends of the control lines 23 and 24 which extend away from the electrodes are referenced 25 and 30 and are received in respective conduits 21 and 29 which are arranged in the insulating ring 3 adjacent one another.

In comparison to FIG. 1, the exemplary embodiment illustrated in FIGS. 2 and 3 has the advantage that only a single slot is required, so that better cooling of the semiconductor element is achieved. Furthermore, this construction is somewhat more favorable in respect of an application as a high frequency thyristor, as none of the control lines requires external disposition about the housing, which could give rise to disturbing inductances, in particular at higher frequencies. For example, it is also possible to use a single conduit, if the latter is provided with a central contact at an outer contact, as is required, for example, in a plug-in connection for a coaxial cable.

Figure 4:
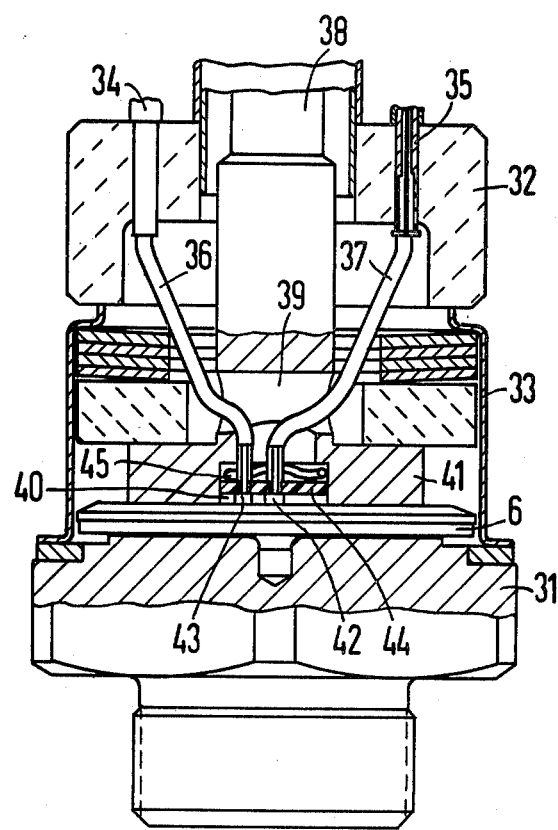
FIG. 4 is a sectional view through a thyristor constructed in accordance with a third embodiment of the invention.

FIGS. 1 and 2 have illustrated exemplary embodiments featuring a disc-shaped housing. FIG. 4, however, illustrates an exemplary embodiment of the invention in which the housing has a screw connection piece. The housing of the thyristor illustrated in FIG. 4 comprises a base plate 31 and an insulating cap 32, both components being connected to one another by a metal tubular component 33. The insulating cap 32 includes a conduit 34 which forms the terminal for a control line 36. The lower end 43 of the control line 36 leads to the auxiliary emitter electrode of the semiconductor element 6 and is contacted with the latter. A further conduit 35 is also contained in the cap and forms the terminal for a control line 37, whose lower end 42 is in contact with the control electrode of the semiconductor element 6. The control lines 36 and 37 open into a recess 40 of a supply electrode 41, which forms the lower part of a supply bolt 38 arranged centrally in the housing. The supply bolt 38 is provided with a radial bore 39 through which the control lines 36 and 37 pass as the same are extended toward the conduits 34 and 35. The ends 42 and 43 of the control lines 36 and 37 are pressed against the corresponding electrodes by a spring 45, by way of an insulating plate 44. The spring 45 can be, for example, a wave spring or the like and bear against a part of the supply electrode 41 which is designed as an abutment shoulder and against the insulating plate 44.

The exemplary embodiment illustrated in FIG. 4 shows two conduits, although here too it is possible to use a single conduit in the form of a coaxial plug.

The exemplary embodiments of the invention described herein have control electrodes and auxiliary emitter electrodes contacted under pressure. However, it is also possible to connect the control lines to the control electrode and the auxiliary emitter electrode in a substance-locking fashion, i.e. by soldering or welding. Furthermore, the present invention can be employed for other types of housings where internal connections are extended to the exterior of a housing.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. A thyristor comprising:
   a first metal plate;
   a second metal plate;
   a conductive foil on said second metal plate;
   an insulating ring connecting said first and second metal plates and therewith forming a housing;
   a semiconductor element carried on said conductive foil within said housing and including a control electrode and a control current amplifier having an auxiliary electrode;

a pair of electrical terminals extending through said insulating ring adjacent one another for providing external circuit connections;

an insulator between said first metal plate and said semiconductor element;

passageway means extending through said insulator and said first metal plate between said electrodes and said terminals; and control lines in said passageway means electrically connecting said electrodes with respective ones of said adjacent electrical terminals.

2. The thyristor of claim 1, comprising:

bias means bearing against said first metal plate and said control lines to urge said control lines against their respective electrodes.

3. A thyristor comprising:

a disc-shaped housing including first and second spaced-apart metal plates and an insulating ring between and connecting said metal plates;

a semiconductor element mounted within said housing and including a control electrode and an auxiliary emitter electrode;

a pair of external connection terminals extending through said insulating ring adjacent one another;

a recess in one of said metal plates opposite said control and auxiliary emitter electrodes;

slot means extending from said recess to said external connection terminals; and first and second control lines disposed in said slot means and respectively electrically connecting said control and auxiliary emitter electrodes to said first and second external connection terminals.

4. The thyristor of claim 3, wherein said one metal plate comprises a single slot constituting said slot means.

5. The thyristor of claim 3, wherein said one metal plate comprises a pair of adjacent slots receiving respective control lines and constituting said slot means.

6. The thyristor of claim 3, wherein said adjacent external connection terminals are designed as a coaxial plug-in connection.

7. The thyristor of claim 3, wherein:

said one metal plate includes first surfaces defining said recess facing said control and auxiliary electrodes and second surfaces defining said slot means extending between said recess and the periphery of said one metal plate, and further comprising bias means urging said control lines into contact with said control and auxiliary electrodes.

8. The thyristor of claim 7, wherein said second surfaces define a single slot as said slot means.

9. The thyristor of claim 7, wherein each of said control lines includes an end bent at a right angle, the extremeties of said bent ends facing the respective electrodes; and wherein said bias means comprises spring means in said recess urging said bent ends against the respective electrodes.

10. The thyristor of claim 7, wherein said bias means comprises at least one helical turn at the end of each of said control lines which contact the respective electrodes.

* * * * *